US010755877B1

(12) United States Patent
Wang et al.

(10) Patent No.: US 10,755,877 B1
(45) Date of Patent: Aug. 25, 2020

(54) KEYBOARD FOR AN ELECTRONIC DEVICE

(71) Applicant: Apple Inc., Cupertino, CA (US)

(72) Inventors: Paul X. Wang, Cupertino, CA (US); Zheng Gao, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 77 days.

(21) Appl. No.: 15/687,297

(22) Filed: Aug. 25, 2017

Related U.S. Application Data

(60) Provisional application No. 62/380,756, filed on Aug. 29, 2016.

(51) Int. Cl.
H01H 13/70 (2006.01)
H03K 17/96 (2006.01)

(52) U.S. Cl.
CPC ......... H01H 13/70 (2013.01); H03K 17/9622 (2013.01); H01H 2215/004 (2013.01); H01H 2223/042 (2013.01); H01H 2233/002 (2013.01); H01H 2233/07 (2013.01)

(58) Field of Classification Search
CPC ............. H01H 13/70; H01H 2215/004; H01H 2223/042; H01H 2233/07; H01H 2233/002; H03K 17/9622
USPC ........................................................ 200/5 A
See application file for complete search history.

(56) References Cited

U.S. PATENT DOCUMENTS

| 3,657,492 | A | 4/1972 | Arndt et al. |
| 3,917,917 | A | 11/1975 | Murata |
| 3,978,297 | A | 8/1976 | Lynn et al. |
| 4,095,066 | A | 6/1978 | Harris |
| 4,319,099 | A | 3/1982 | Asher |
| 4,349,712 | A | 9/1982 | Michalski |
| 4,370,533 | A * | 1/1983 | Kamei ................... H01H 13/14 200/5 A |
| 4,484,042 | A | 11/1984 | Matsui |
| 4,596,905 | A | 6/1986 | Fowler |
| 4,598,181 | A | 7/1986 | Selby |
| 4,670,084 | A | 6/1987 | Durand et al. |
| 4,755,645 | A | 7/1988 | Naoki et al. |
| 4,937,408 | A | 6/1990 | Hattori et al. |

(Continued)

FOREIGN PATENT DOCUMENTS

| CN | 2155620 | 2/1994 |
| CN | 2394309 | 8/2000 |

(Continued)

OTHER PUBLICATIONS

Elekson, "Reliable and Tested Wearable Electronics Embedment Solutions," http://www.wearable.technology/our-technologies, 3 pages, at least as early as Jan. 6, 2016.

Primary Examiner — Edwin A. Leon
Assistant Examiner — Lheiren Mae A Caroc
(74) Attorney, Agent, or Firm — Dorsey & Whitney LLP

(57) ABSTRACT

A keyboard is disclosed. The keyboard includes a keyboard housing and a switch assembly coupled to the keyboard housing. The switch assembly includes a switch body defining an interior volume, a collapsible dome positioned in the interior volume, an actuation member configured to actuate the collapsible dome in response to an actuation of the actuation member, and a cover coupled to the switch body. The cover retains the actuation member to the switch body. The keyboard also includes a flexible material coupled to the keyboard housing and extending over the actuation member.

19 Claims, 10 Drawing Sheets

(56) References Cited

U.S. PATENT DOCUMENTS

| | | |
|---|---|---|
| 4,987,275 A | 1/1991 | Miller et al. |
| 5,021,638 A | 6/1991 | Nopper et al. |
| 5,092,459 A | 3/1992 | Uljanic et al. |
| 5,136,131 A | 8/1992 | Komaki |
| 5,278,372 A | 1/1994 | Takagi et al. |
| 5,280,146 A | 1/1994 | Inagaki et al. |
| 5,340,955 A | 8/1994 | Calvillo et al. |
| 5,382,762 A | 1/1995 | Mochizuki |
| 5,397,867 A | 3/1995 | Demeo |
| 5,408,060 A | 4/1995 | Muurinen |
| 5,421,659 A | 6/1995 | Liang |
| 5,422,447 A | 6/1995 | Spence |
| 5,457,297 A | 10/1995 | Chen |
| 5,477,430 A | 12/1995 | LaRose et al. |
| 5,481,074 A | 1/1996 | English |
| 5,504,283 A | 4/1996 | Kako et al. |
| 5,512,719 A | 4/1996 | Okada et al. |
| 5,625,532 A | 4/1997 | Sellers |
| 5,804,780 A | 9/1998 | Bartha |
| 5,828,015 A | 10/1998 | Coulon |
| 5,847,337 A | 12/1998 | Chen |
| 5,874,700 A | 2/1999 | Hochgesang |
| 5,875,013 A | 2/1999 | Takahara |
| 5,876,106 A | 3/1999 | Kordecki et al. |
| 5,878,872 A | 3/1999 | Tsai |
| 5,881,866 A | 3/1999 | Miyajima et al. |
| 5,898,147 A | 4/1999 | Domzaiski et al. |
| 5,924,555 A | 7/1999 | Sadamori et al. |
| 5,935,691 A | 8/1999 | Tsai |
| 5,960,942 A | 10/1999 | Thornton |
| 5,986,227 A | 11/1999 | Hon |
| 6,020,565 A | 2/2000 | Pan |
| 6,068,416 A | 5/2000 | Kumamoto et al. |
| 6,215,420 B1 | 4/2001 | Harrison et al. |
| 6,257,782 B1 | 7/2001 | Maruyama et al. |
| 6,259,046 B1 | 7/2001 | Iwama et al. |
| 6,377,685 B1 | 4/2002 | Krishnan |
| 6,388,219 B2 | 5/2002 | Hsu et al. |
| 6,423,918 B1 | 7/2002 | King et al. |
| 6,482,032 B1 | 11/2002 | Szu et al. |
| 6,530,283 B2 | 3/2003 | Okada et al. |
| 6,538,801 B2 | 3/2003 | Jacobson et al. |
| 6,542,355 B1 | 4/2003 | Huang |
| 6,552,287 B2 | 4/2003 | Janniere |
| 6,556,112 B1 | 4/2003 | Van Zeeland et al. |
| 6,559,399 B2 | 5/2003 | Hsu et al. |
| 6,560,612 B1 | 5/2003 | Yamada et al. |
| 6,572,289 B2 | 6/2003 | Lo et al. |
| 6,573,463 B2 | 6/2003 | Ono |
| 6,585,435 B2 | 7/2003 | Fang |
| 6,624,369 B2 | 9/2003 | Ito et al. |
| 6,706,986 B2 | 3/2004 | Hsu |
| 6,738,050 B2 | 5/2004 | Comiskey |
| 6,750,414 B2 | 6/2004 | Sullivan |
| 6,759,614 B2 | 7/2004 | Yoneyama |
| 6,762,381 B2 | 7/2004 | Kunthady et al. |
| 6,765,503 B1 | 7/2004 | Chan et al. |
| 6,788,450 B2 | 9/2004 | Kawai et al. |
| 6,797,906 B2 | 9/2004 | Ohashi |
| 6,850,227 B2 | 2/2005 | Takahashi et al. |
| 6,860,660 B2 | 3/2005 | Hochgesang et al. |
| 6,911,608 B2 | 6/2005 | Levy |
| 6,926,418 B2 | 8/2005 | Ostergågrd et al. |
| 6,940,030 B2 | 9/2005 | Takeda et al. |
| 6,977,352 B2 | 12/2005 | Oosawa |
| 6,979,792 B1 | 12/2005 | Lai |
| 6,987,466 B1 | 1/2006 | Welch et al. |
| 6,987,503 B2 | 1/2006 | Inoue |
| 7,012,206 B2 | 3/2006 | Oikawa |
| 7,030,330 B2 | 4/2006 | Suda |
| 7,038,832 B2 | 5/2006 | Kanbe |
| 7,126,499 B2 | 10/2006 | Lin et al. |
| 7,129,930 B1 | 10/2006 | Cathey et al. |
| 7,134,205 B2 | 11/2006 | Bruennel |
| 7,146,701 B2 | 12/2006 | Mahoney et al. |
| 7,151,236 B2 | 12/2006 | Ducruet et al. |
| 7,151,237 B2 | 12/2006 | Mahoney et al. |
| 7,154,059 B2 | 12/2006 | Chou |
| 7,166,813 B2 | 1/2007 | Soma |
| 7,172,303 B2 | 2/2007 | Shipman et al. |
| 7,189,932 B2 | 3/2007 | Kim |
| 7,256,766 B2 | 8/2007 | Albert et al. |
| 7,283,119 B2 | 10/2007 | Kishi |
| 7,301,113 B2 | 11/2007 | Nishimura et al. |
| 7,312,790 B2 | 12/2007 | Sato et al. |
| 7,378,607 B2 | 5/2008 | Koyano et al. |
| 7,385,806 B2 | 6/2008 | Liao |
| 7,391,555 B2 | 6/2008 | Albert et al. |
| 7,414,213 B2 | 8/2008 | Hwang |
| 7,429,707 B2 | 9/2008 | Yanai et al. |
| 7,432,460 B2 | 10/2008 | Clegg |
| 7,510,342 B2 | 3/2009 | Lane et al. |
| 7,531,764 B1 | 5/2009 | Lev et al. |
| 7,541,554 B2 | 6/2009 | Hou |
| 7,589,292 B2 | 9/2009 | Jung et al. |
| 7,639,187 B2 | 12/2009 | Caballero et al. |
| 7,639,571 B2 | 12/2009 | Ishii et al. |
| 7,651,231 B2 | 1/2010 | Chou et al. |
| 7,679,010 B2 | 3/2010 | Wingett |
| 7,724,415 B2 | 5/2010 | Yamaguchi |
| 7,781,690 B2 | 8/2010 | Ishii |
| 7,813,774 B2 | 10/2010 | Perez-Noguera |
| 7,842,895 B2 | 11/2010 | Lee |
| 7,847,204 B2 | 12/2010 | Tsai |
| 7,851,819 B2 | 12/2010 | Shi |
| 7,866,866 B2 | 1/2011 | Wahlstrom |
| 7,893,376 B2 | 2/2011 | Chen |
| 7,923,653 B2 | 4/2011 | Ohsumi |
| 7,947,915 B2 | 5/2011 | Lee et al. |
| 7,999,748 B2 | 8/2011 | Ligtenberg et al. |
| 8,063,325 B2 | 11/2011 | Sung et al. |
| 8,077,096 B2 | 12/2011 | Chiang et al. |
| 8,080,744 B2 | 12/2011 | Yeh et al. |
| 8,098,228 B2 | 1/2012 | Shimodaira et al. |
| 8,109,650 B2 | 2/2012 | Chang et al. |
| 8,119,945 B2 | 2/2012 | Lin |
| 8,124,903 B2 | 2/2012 | Tatehata et al. |
| 8,134,094 B2 | 3/2012 | Tsao et al. |
| 8,143,982 B1 | 3/2012 | Lauder et al. |
| 8,156,172 B2 | 4/2012 | Muehl et al. |
| 8,178,808 B2 | 5/2012 | Strittmatter et al. |
| 8,184,021 B2 | 5/2012 | Chou |
| 8,212,160 B2 | 7/2012 | Tsao |
| 8,212,162 B2 | 7/2012 | Zhou |
| 8,218,301 B2 | 7/2012 | Lee |
| 8,232,958 B2 | 7/2012 | Tolbert |
| 8,246,228 B2 | 8/2012 | Ko et al. |
| 8,253,048 B2 | 8/2012 | Ozias et al. |
| 8,253,052 B2 | 9/2012 | Chen |
| 8,263,887 B2 | 9/2012 | Chen et al. |
| 8,289,280 B2 | 10/2012 | Travis |
| 8,299,382 B2 | 10/2012 | Takemae et al. |
| 8,317,384 B2 | 11/2012 | Chung et al. |
| 8,319,298 B2 | 11/2012 | Hsu |
| 8,325,141 B2 | 12/2012 | Marsden |
| 8,330,725 B2 | 12/2012 | Mahowald et al. |
| 8,354,629 B2 | 1/2013 | Lin |
| 8,378,857 B2 | 2/2013 | Pance |
| 8,383,972 B2 | 2/2013 | Liu |
| 8,384,566 B2 | 2/2013 | Bocirnea |
| 8,404,990 B2 | 3/2013 | Lutgring et al. |
| 8,451,146 B2 | 3/2013 | Mahowald et al. |
| 8,431,849 B2 | 4/2013 | Chen |
| 8,436,265 B2 | 5/2013 | Koike et al. |
| 8,462,514 B2 | 6/2013 | Myers et al. |
| 8,500,348 B2 | 8/2013 | Dumont et al. |
| 8,502,094 B2 | 8/2013 | Chen |
| 8,542,194 B2 | 9/2013 | Akens et al. |
| 8,548,528 B2 | 10/2013 | Kim et al. |
| 8,564,544 B2 | 10/2013 | Jobs et al. |
| 8,569,639 B2 | 10/2013 | Strittmatter |
| 8,575,632 B2 | 11/2013 | Kuramoto et al. |
| 8,581,127 B2 | 11/2013 | Jhuang et al. |
| 8,592,699 B2 | 11/2013 | Kessler et al. |

(56) References Cited

U.S. PATENT DOCUMENTS

| | | |
|---|---|---|
| 8,592,702 B2 | 11/2013 | Tsai |
| 8,592,703 B2 | 11/2013 | Johnson et al. |
| 8,604,370 B2 | 12/2013 | Chao |
| 8,629,362 B1 | 1/2014 | Knighton et al. |
| 8,642,904 B2 | 2/2014 | Chiba et al. |
| 8,651,720 B2 | 2/2014 | Sherman et al. |
| 8,659,882 B2 | 2/2014 | Liang et al. |
| 8,731,618 B2 | 5/2014 | Jarvis et al. |
| 8,748,767 B2 | 6/2014 | Ozias et al. |
| 8,759,705 B2 | 6/2014 | Funakoshi et al. |
| 8,760,405 B2 | 6/2014 | Nam |
| 8,786,548 B2 | 7/2014 | Oh et al. |
| 8,791,378 B2 | 7/2014 | Lan |
| 8,835,784 B2 | 9/2014 | Hirota |
| 8,847,090 B2 | 9/2014 | Ozaki |
| 8,847,711 B2 | 9/2014 | Yang et al. |
| 8,853,580 B2 | 10/2014 | Chen |
| 8,854,312 B2 | 10/2014 | Meierling |
| 8,870,477 B2 | 10/2014 | Merminod et al. |
| 8,884,174 B2 | 11/2014 | Chou et al. |
| 8,921,473 B1 | 12/2014 | Hyman |
| 8,922,476 B2 | 12/2014 | Stewart et al. |
| 8,943,427 B2 | 1/2015 | Heo et al. |
| 8,976,117 B2 | 3/2015 | Krahenbuhl et al. |
| 8,994,641 B2 | 3/2015 | Stewart et al. |
| 9,007,297 B2 | 4/2015 | Stewart et al. |
| 9,012,795 B2 | 4/2015 | Niu et al. |
| 9,024,214 B2 | 5/2015 | Niu et al. |
| 9,029,723 B2 | 5/2015 | Pegg |
| 9,063,627 B2 | 6/2015 | Yairi et al. |
| 9,064,642 B2 | 6/2015 | Welch et al. |
| 9,086,733 B2 | 7/2015 | Pance |
| 9,087,663 B2 | 7/2015 | Los |
| 9,093,229 B2 | 7/2015 | Leong et al. |
| 9,213,416 B2 | 12/2015 | Chen |
| 9,223,352 B2 | 12/2015 | Smith et al. |
| 9,234,486 B2 | 1/2016 | Das et al. |
| 9,235,236 B2 | 1/2016 | Nam |
| 9,274,654 B2 | 3/2016 | Slobodin et al. |
| 9,275,810 B2 | 3/2016 | Pance et al. |
| 9,300,033 B2 | 3/2016 | Han et al. |
| 9,305,496 B2 | 4/2016 | Kimura |
| 9,405,369 B2 | 8/2016 | Modarres et al. |
| 9,412,533 B2 | 8/2016 | Hendren et al. |
| 9,443,672 B2 | 9/2016 | Martisauskas |
| 9,448,628 B2 | 9/2016 | Tan et al. |
| 9,448,631 B2 | 9/2016 | Winter et al. |
| 9,449,772 B2 | 9/2016 | Leong et al. |
| 9,471,185 B2 | 10/2016 | Guard |
| 9,477,382 B2 | 10/2016 | Hicks et al. |
| 9,502,193 B2 | 11/2016 | Niu et al. |
| 9,612,674 B2 | 4/2017 | Degner et al. |
| 9,640,347 B2 | 5/2017 | Kwan et al. |
| 9,704,665 B2 | 7/2017 | Brock et al. |
| 9,704,670 B2 | 7/2017 | Leong et al. |
| 9,710,069 B2 | 7/2017 | Leong et al. |
| 9,715,978 B2 | 7/2017 | Hendren |
| 9,734,965 B2 | 8/2017 | Martinez et al. |
| 9,761,389 B2 | 9/2017 | Leong et al. |
| 9,793,066 B1 | 10/2017 | Brock et al. |
| 9,898,094 B2 * | 2/2018 | Huang ................ G06F 3/0216 |
| 2002/0079211 A1 | 6/2002 | Katayama et al. |
| 2002/0093436 A1 | 7/2002 | Lien |
| 2002/0113770 A1 | 8/2002 | Jacobson et al. |
| 2002/0149835 A1 | 10/2002 | Kanbe |
| 2003/0169232 A1 | 9/2003 | Ito |
| 2004/0004559 A1 | 1/2004 | Rast |
| 2004/0225965 A1 | 11/2004 | Garside et al. |
| 2005/0035950 A1 | 2/2005 | Daniels |
| 2005/0253801 A1 | 11/2005 | Kobayashi |
| 2006/0011458 A1 | 1/2006 | Purcocks |
| 2006/0020469 A1 | 1/2006 | Rast |
| 2006/0120790 A1 | 6/2006 | Chang |
| 2006/0181511 A1 | 8/2006 | Woolley |
| 2006/0243987 A1 | 11/2006 | Lai |
| 2007/0200823 A1 | 8/2007 | Bytheway et al. |
| 2007/0285393 A1 | 12/2007 | Ishakov |
| 2008/0131184 A1 | 6/2008 | Brown et al. |
| 2008/0136782 A1 | 6/2008 | Mundt et al. |
| 2008/0251370 A1 | 10/2008 | Aoki |
| 2009/0008234 A1 * | 1/2009 | Tolbert ................ H01H 13/702 200/600 |
| 2009/0046053 A1 | 2/2009 | Shigehiro et al. |
| 2009/0103964 A1 | 4/2009 | Takagi et al. |
| 2009/0128496 A1 | 5/2009 | Huang |
| 2009/0262085 A1 | 10/2009 | Wassingbo et al. |
| 2009/0267892 A1 | 10/2009 | Faubert |
| 2010/0045705 A1 | 2/2010 | Vertegaal et al. |
| 2010/0066568 A1 | 3/2010 | Lee |
| 2010/0109921 A1 | 5/2010 | Annerfors |
| 2010/0156796 A1 | 6/2010 | Kim et al. |
| 2010/0253630 A1 | 10/2010 | Homma et al. |
| 2011/0032127 A1 | 2/2011 | Roush |
| 2011/0056817 A1 | 3/2011 | Wu |
| 2011/0056836 A1 | 3/2011 | Tatebe et al. |
| 2011/0205179 A1 | 8/2011 | Braun |
| 2011/0261031 A1 | 10/2011 | Muto |
| 2011/0267272 A1 | 11/2011 | Meyer et al. |
| 2011/0284355 A1 | 11/2011 | Yang |
| 2012/0012446 A1 | 1/2012 | Hwa |
| 2012/0032972 A1 | 2/2012 | Hwang |
| 2012/0090973 A1 | 4/2012 | Liu |
| 2012/0098751 A1 | 4/2012 | Liu |
| 2012/0286701 A1 | 11/2012 | Yang et al. |
| 2012/0298496 A1 | 11/2012 | Zhang |
| 2012/0313856 A1 | 12/2012 | Hsieh |
| 2013/0043115 A1 | 2/2013 | Yang et al. |
| 2013/0093500 A1 | 4/2013 | Bruwer |
| 2013/0093733 A1 | 4/2013 | Yoshida |
| 2013/0100030 A1 | 4/2013 | Los et al. |
| 2013/0120265 A1 | 5/2013 | Horii et al. |
| 2013/0140165 A1 * | 6/2013 | Lin ................ G06F 3/0202 200/5 A |
| 2013/0161170 A1 | 6/2013 | Fan et al. |
| 2013/0215079 A1 | 8/2013 | Johnson et al. |
| 2013/0242601 A1 | 9/2013 | Kloeppel et al. |
| 2013/0270090 A1 | 10/2013 | Lee |
| 2014/0015777 A1 | 1/2014 | Park et al. |
| 2014/0027259 A1 | 1/2014 | Kawana et al. |
| 2014/0071654 A1 | 3/2014 | Chien |
| 2014/0082490 A1 | 3/2014 | Jung et al. |
| 2014/0090967 A1 | 4/2014 | Inagaki |
| 2014/0098042 A1 | 4/2014 | Kuo et al. |
| 2014/0151211 A1 | 6/2014 | Zhang |
| 2014/0184496 A1 | 7/2014 | Gribetz et al. |
| 2014/0191973 A1 | 7/2014 | Zellers et al. |
| 2014/0218851 A1 | 8/2014 | Klein et al. |
| 2014/0252881 A1 | 9/2014 | Dinh et al. |
| 2014/0291133 A1 | 10/2014 | Fu et al. |
| 2014/0375141 A1 | 12/2014 | Nakajima |
| 2015/0016038 A1 | 1/2015 | Niu et al. |
| 2015/0041298 A1 * | 2/2015 | Izawa ................ H01H 13/023 200/5 A |
| 2015/0083561 A1 | 3/2015 | Han et al. |
| 2015/0270073 A1 | 9/2015 | Yarak, III et al. |
| 2015/0277559 A1 | 10/2015 | Vescovi et al. |
| 2015/0287553 A1 | 10/2015 | Welch et al. |
| 2015/0309538 A1 | 10/2015 | Zhang |
| 2015/0370339 A1 | 12/2015 | Ligtenberg et al. |
| 2015/0378391 A1 | 12/2015 | Huitema et al. |
| 2016/0049266 A1 * | 2/2016 | Stringer ................ H01H 13/704 200/5 A |
| 2016/0093452 A1 | 3/2016 | Zercoe et al. |
| 2016/0172129 A1 | 6/2016 | Zercoe et al. |
| 2016/0189890 A1 | 6/2016 | Leong et al. |
| 2016/0189891 A1 | 6/2016 | Zercoe et al. |
| 2016/0259375 A1 | 9/2016 | Andre et al. |
| 2016/0329166 A1 | 11/2016 | Hou et al. |
| 2016/0336124 A1 | 11/2016 | Leong et al. |
| 2016/0336127 A1 | 11/2016 | Leong et al. |
| 2016/0336128 A1 | 11/2016 | Leong et al. |
| 2016/0343523 A1 | 11/2016 | Hendren et al. |
| 2016/0351360 A1 | 12/2016 | Knopf et al. |
| 2016/0365204 A1 | 12/2016 | Cao et al. |

(56) References Cited

U.S. PATENT DOCUMENTS

| | | | |
|---|---|---|---|
| 2016/0378234 | A1 | 12/2016 | Ligtenberg et al. |
| 2016/0379775 | A1 | 12/2016 | Leong et al. |
| 2017/0004939 | A1 | 1/2017 | Kwan et al. |
| 2017/0011869 | A1 | 1/2017 | Knopf et al. |
| 2017/0090104 | A1 | 3/2017 | Cao et al. |
| 2017/0090106 | A1 | 3/2017 | Cao et al. |
| 2017/0301487 | A1 | 10/2017 | Leong et al. |
| 2017/0315624 | A1 | 11/2017 | Leong et al. |
| 2018/0029339 | A1 | 2/2018 | Liu et al. |
| 2018/0040441 | A1 | 2/2018 | Wu et al. |
| 2018/0074694 | A1 | 3/2018 | Lehmann et al. |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1838036 | 9/2006 |
| CN | 1855332 | 11/2006 |
| CN | 101051569 | 10/2007 |
| CN | 200961844 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101438228 | 5/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 101868773 | 10/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102338348 | 2/2012 |
| CN | 102375550 | 3/2012 |
| CN | 202205161 | 4/2012 |
| CN | 102496509 | 6/2012 |
| CN | 10269527 | 8/2012 |
| CN | 102622089 | 8/2012 |
| CN | 102629526 | 8/2012 |
| CN | 202372927 | 8/2012 |
| CN | 102679239 | 9/2012 |
| CN | 102683072 | 9/2012 |
| CN | 202434387 | 9/2012 |
| CN | 202523007 | 11/2012 |
| CN | 102832068 | 12/2012 |
| CN | 102955573 | 3/2013 |
| CN | 102956386 | 3/2013 |
| CN | 102969183 | 3/2013 |
| CN | 103000417 | 3/2013 |
| CN | 103165327 | 6/2013 |
| CN | 103180979 | 6/2013 |
| CN | 203012648 | 6/2013 |
| CN | 203135988 | 8/2013 |
| CN | 103377841 | 10/2013 |
| CN | 103489986 | 1/2014 |
| CN | 203414880 | 1/2014 |
| CN | 103681056 | 3/2014 |
| CN | 103699181 | 4/2014 |
| CN | 203520312 | 4/2014 |
| CN | 203588895 | 5/2014 |
| CN | 103839715 | 6/2014 |
| CN | 103839720 | 6/2014 |
| CN | 103839722 | 6/2014 |
| CN | 103903891 | 7/2014 |
| CN | 103956290 | 7/2014 |
| CN | 203733685 | 7/2014 |
| CN | 104021968 | 9/2014 |
| CN | 204102769 | 1/2015 |
| CN | 204117915 | 1/2015 |
| CN | 104517769 | 4/2015 |
| CN | 204632641 | 9/2015 |
| CN | 105097341 | 11/2015 |
| DE | 2530176 | 1/1977 |
| DE | 3002772 | 7/1981 |
| DE | 29704100 | 4/1997 |
| DE | 202008001970 | 8/2008 |
| EP | 0441993 | 8/1991 |
| EP | 1835272 | 9/2007 |
| EP | 1928008 | 6/2008 |
| EP | 2202606 | 6/2010 |
| EP | 2426688 | 3/2012 |
| EP | 2439760 | 4/2012 |
| EP | 2463798 | 6/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | H05342944 | 12/1993 |
| JP | H09204148 | 8/1997 |
| JP | H10312726 | 11/1998 |
| JP | H11194882 | 7/1999 |
| JP | 2000010709 | 1/2000 |
| JP | 2000057871 | 2/2000 |
| JP | 2000339097 | 12/2000 |
| JP | 2001100889 | 4/2001 |
| JP | 2003114751 | 9/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006269439 | 10/2006 |
| JP | 2006277013 | 10/2006 |
| JP | 2006344609 | 12/2006 |
| JP | 2007115633 | 5/2007 |
| JP | 2007514247 | 5/2007 |
| JP | 2007156983 | 6/2007 |
| JP | 2008021428 | 1/2008 |
| JP | 2008041431 | 2/2008 |
| JP | 2008100129 | 5/2008 |
| JP | 2008191850 | 8/2008 |
| JP | 2008533559 | 8/2008 |
| JP | 2008293922 | 12/2008 |
| JP | 2009099503 | 5/2009 |
| JP | 2009181894 | 8/2009 |
| JP | 2010061956 | 3/2010 |
| JP | 2010244088 | 10/2010 |
| JP | 2010244302 | 10/2010 |
| JP | 2011018484 | 1/2011 |
| JP | 2011065126 | 3/2011 |
| JP | 2011150804 | 8/2011 |

(56) References Cited

FOREIGN PATENT DOCUMENTS

| | | |
|---|---|---|
| JP | 2011165630 | 8/2011 |
| JP | 2011524066 | 8/2011 |
| JP | 2011187297 | 9/2011 |
| JP | 2012022473 | 2/2012 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014026807 | 2/2014 |
| JP | 2014216190 | 11/2014 |
| JP | 2014220039 | 11/2014 |
| JP | 2016053778 | 4/2016 |
| KR | 1019990007394 | 1/1999 |
| KR | 1020020001668 | 1/2002 |
| KR | 100454203 | 10/2004 |
| KR | 1020060083032 | 7/2006 |
| KR | 1020080064116 | 7/2008 |
| KR | 1020080066164 | 7/2008 |
| KR | 2020110006385 | 6/2011 |
| KR | 1020120062797 | 6/2012 |
| KR | 1020130040131 | 4/2013 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2007/049253 | 5/2007 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2013/096478 | 6/2013 |
| WO | WO2014175446 | 10/2014 |

\* cited by examiner

KEYBOARD FOR AN ELECTRONIC DEVICE

CROSS-REFERENCE TO RELATED APPLICATION(S)

This application is a nonprovisional patent application of and claims the benefit of U.S. Provisional Patent Application No. 62/380,756, filed Aug. 29, 2016 and titled "Keyboard for Electronic Device," the disclosure of which is hereby incorporated herein by reference in its entirety.

FIELD

The described embodiments relate generally to electronic devices, and more particularly to input devices for electronic devices.

BACKGROUND

Many electronic devices include one or more input devices such as keyboards, touchpads, mice, or touchscreens to enable a user to interact with the device. These devices can be integrated into an electronic device or can stand alone as discrete devices that can transmit signals to another device either via wired or wireless connection. For example, a keyboard can be integrated into the housing of a laptop computer or it can exist in its own housing.

The keys of a keyboard may include various mechanical and electrical components to facilitate the mechanical and electrical functions of the keyboard. For example, a key may include mechanical structures to allow the key to move or depress when actuated, as well as electrical components to allow an electrical signal to be produced in response to actuation. Due to the relatively small size of such components, as well as the relatively high number of such components contained in a keyboard, designing and manufacturing keyboards may be complex and difficult undertakings.

SUMMARY

A switch assembly for a keyboard includes a switch housing. The switch housing includes a switch body defining an interior volume and a cover defining an opening. The switch assembly also includes a collapsible dome within the interior volume and an actuation member positioned in the opening and comprising a retention feature. The retention feature engages the switch body, thereby retaining the actuation member to the switch housing and retaining the collapsible dome within the interior volume. The switch assembly also includes a terminal retained to the switch housing and comprising a first portion configured to be contacted by the collapsible dome when the actuation member is depressed. The switch housing, the collapsible dome, the actuation member, and the terminal are assembled into an integrated unit configured to be mounted directly on a keyboard base.

The switch assembly may be incorporated into a keyboard comprising additional switch assemblies, with each additional switch assembly comprising an additional switch housing, an additional actuation member, and an additional terminal retained to the switch housing. The switch assembly and the additional switch assemblies may be electrically coupled to the keyboard base via the terminal and the additional terminals. The actuation members of the switch assembly and the additional switch assemblies may each define a shape of a user-interface portion of a respective key of the keyboard.

A first portion of the terminal may be exposed to the interior volume, a second portion of the terminal may be exposed on an exterior surface of the switch body, and the switch assembly may be configured to be mounted on the keyboard base via a surface mount process whereby the second portion of the terminal is placed in contact with a conductive terminal of the keyboard base.

The cover of the switch housing may be secured to the switch body of the switch housing, the retention feature may be a flange, the flange may overlap a surface of the cover of the switch housing, and may be the collapsible dome may bias the actuation member in an undepressed position. The terminal may be at least partially encapsulated in the switch body. The terminal may be a first terminal, and the switch housing may further comprise a second terminal within the switch housing and in contact with the collapsible dome when the actuation member is depressed and when the actuation member is undepressed.

A keyboard includes a keyboard housing and a switch assembly coupled to the keyboard housing. The switch assembly includes a switch body defining an interior volume, a collapsible dome positioned in the interior volume, an actuation member configured to actuate the collapsible dome in response to an actuation of the actuation member, and a cover coupled to the switch body. The cover retains the actuation member to the switch body. The keyboard also includes a flexible material coupled to the keyboard housing and extending over the actuation member.

The flexible material may define an exterior surface of the keyboard. The flexible material may be a woven fabric. The flexible material may be bonded to the keyboard housing. A first side the actuation member may contact the collapsible dome, and a second side of the actuation member may contact the flexible material.

The terminal may be a first terminal, the keyboard may be coupled to a keyboard base, the switch body may further comprise a second terminal molded therein, and the first and second terminals may be electrically coupled to the collapsible dome and to electrical contacts on the keyboard base.

The switch assembly may be a first switch assembly, the keyboard may further comprise a group of second switch assemblies, and the flexible material may extend over the group of second switch assemblies.

A switch assembly includes a switch housing. The switch housing includes a switch body defining an interior volume and a cover defining an opening. The switch assembly further includes an actuation member positioned in the opening and comprising a group of retention tabs engaged with the switch housing to retain the actuation member to the switch housing. The opening is defined by an edge comprising a group of recesses configured to allow the group of retention tabs to pass into the interior volume of the switch body.

The actuation member may include a substantially cylindrical shaft, and a substantially rectangular cap portion at an end of the shaft. The shaft and the cap portion may be a monolithic component. The cap portion may overhang the cover of the switch housing. The switch housing may comprise a protrusion configured to limit rotational travel of the actuation member.

A keyboard includes a keyboard base and a group of switch assemblies coupled to the keyboard base. Each switch assembly includes a switch housing and an actuation member within the switch housing. The keyboard further includes a flexible material covering the group of switch assemblies. The switch housings of at least two adjacent switch assemblies abut one another. The keyboard may not include a web above the switch housings.

The flexible material may be bonded to top surfaces of the switch housings. The top surfaces of the switch housings may define a continuous surface framing each of the actuation members. The flexible material may be bonded to top surfaces of the actuation members.

The flexible material may comprise sensing elements configured to be coupled to touch-sensing circuitry of an electronic device. The flexible material may comprise a woven fabric, and the sensing elements may comprise a first conductive element woven into the woven fabric and configured to act as a capacitive drive element, and a second conductive element woven into the woven fabric and configured to act as a capacitive sense element.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
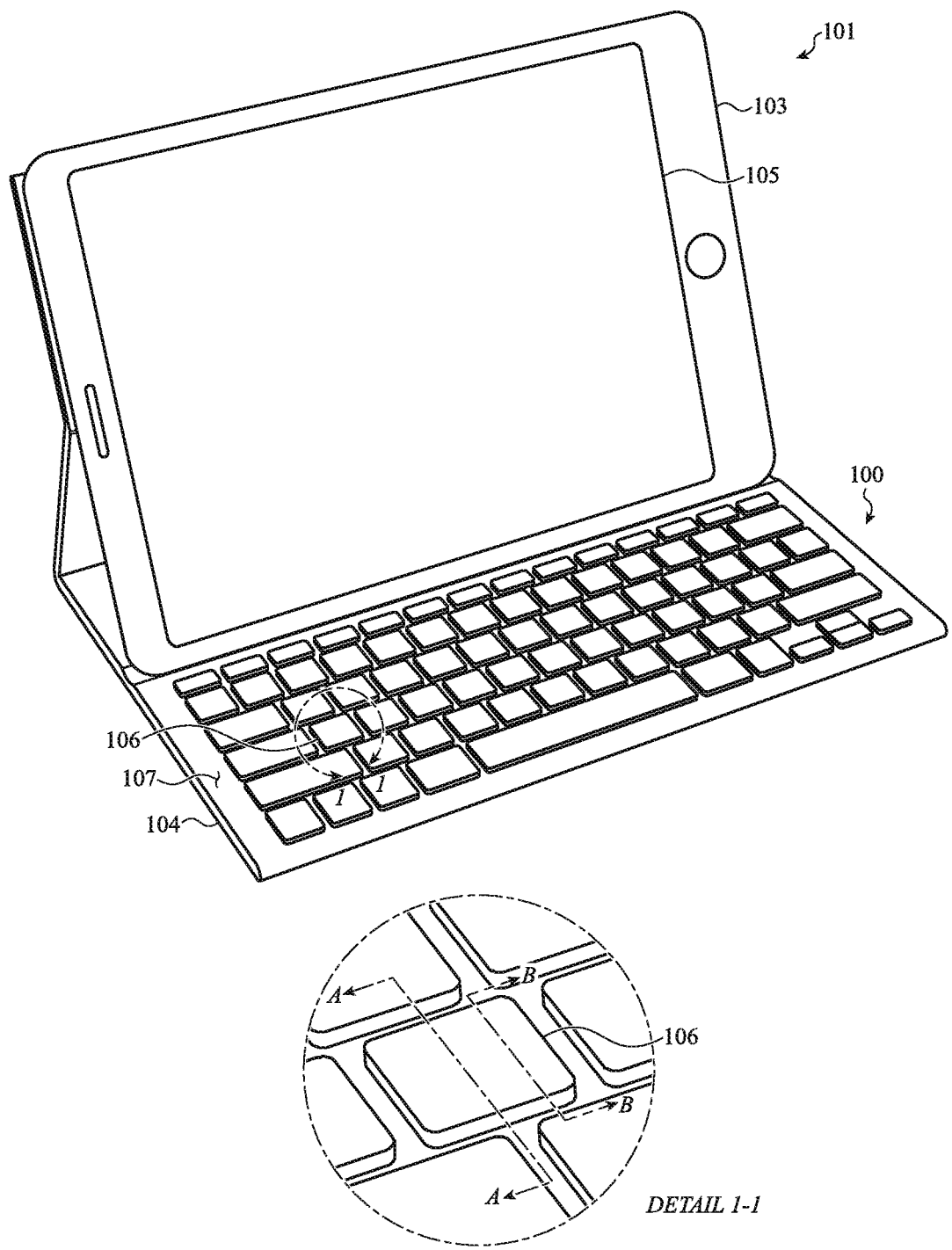
FIG. 1A shows an example computing device incorporating a keyboard.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Keyboards use various different mechanisms to provide mechanical and electrical functionality. For example, keys may include springs or domes to bias the keys to an undepressed or unactuated position. Keys may also include electrical contacts, terminals, or switches to detect when a key has been depressed or actuated in order to provide a corresponding input signal to an electronic device.

Manufacturing a keyboard can be challenging. For example, the trend towards smaller devices, such as thinner computers and keyboards, as well as the general requirement for most keyboards to be easily actuated by the fingertips of a person, means that individual key mechanisms are often relatively small. Moreover, keyboards require that a large number of small components be accurately and precisely aligned in order for the device to operate properly. If even one key in a fully assembled keyboard is not working properly, the entire keyboard may be deemed defective. Accordingly, described herein is a keyboard, and components thereof, that can be manufactured with a high degree of accuracy and precision and that results in a low failure rate for the completed keyboards. The modularized components and/or subassemblies described herein may allow more efficient and accurate assembly of keyboards, among other possible benefits, such as the ability to individually test components and subassemblies before they are assembled into a final product. Embodiments may also facilitate fast and scalable assembly processes.

As described herein, several components of a key may be assembled into a modularized or integrated unit or subassembly that can be easily coupled (or otherwise attached) to a keyboard base. More particularly, a switch assembly, including a switching element such as a dome, a switch housing, an actuation member (e.g., a keycap or other interface member), and an optional support mechanism (e.g., a scissor or hinge mechanism), may be pre-assembled for the keys. The dome (or other suitable switching element), actuation member, and other components, may be retained to the switch housing such that the switch assembly forms a single integrated or modular unit. In turn, the integrated or modular unit can be coupled to a keyboard base. The switch housing may also include terminals molded therein; these terminals may electrically couple the dome to the keyboard base in order to generate an input signal when the dome collapses. Similarly, the switch housing may include other electrical components, such as light sources, electrical terminals for the light sources, or the like, molded therein.

Because the switch assembly is pre-assembled with the dome and actuation member (and optionally other components) affixed to, or otherwise incorporated with, the switch housing (thereby forming an integrated unit), the switch assembly can be more easily handled by manufacturing equipment including pick-and-place machines, tape-and-reel machines, surface mount technology machines, or other automation equipment, and which may use any appropriate surface mount processes to align, place, and attach the switch assembly to another component. Moreover, because such components (e.g., the dome, actuation member, a light source, terminals, and the like) are retained to or otherwise integrated with the switch housing, it may not be necessary to separately align and/or couple these components to the keyboard base. By contrast, separately coupling a switch housing, a dome, a support mechanism, and a light source to a base increases the chances that a misaligned part will render a keyboard defective.

FIG. 1A shows a keyboard 100 for use with a computing device 101. The keyboard 100 includes a group of keys (including a representative key 106) and a keyboard housing 104. The keyboard 100 may include a flexible material 107 positioned over the keys, although this is not necessary or present in all embodiments. In particular, in some embodiments, the keycaps or actuation members of the keyboard may not be covered, such that the surfaces of the keycaps or actuation members are configured to be contacted directly by a user's finger or other implement.

The optional flexible material 107 may be a sheet such as a fabric, polymer, or leather sheet, or any other appropriate deformable or flexible material or sheet. The flexible material 107 may extend over the actuation members of the keys (e.g., the actuation members 204, FIG. 2) and/or over a portion of the keyboard housing 104, thus forming an external surface of the keyboard housing 104 and an actuation surface of the keys. The flexible material 107 may be bonded to the keyboard housing 104 and/or the actuation members of the keys. In some cases, the flexible material 107 may be bonded to the keyboard housing 104 and not bonded to the actuation members, such that the flexible material floats over the surfaces of the actuation members.

The computing device 101 is depicted as a tablet computer that includes a housing 103 and a display 105 (which may be a touch-sensitive display). As shown, the keyboard 100 is a peripheral input device for the computing device 101, and is incorporated into a cover or case for the computing device 101, which may be removable or detachable from the computing device 101. However, in other embodiments, the keyboard 100 may be incorporated within a housing of a computing device (rather than in its own separate housing), or it may be housed in a different housing or structure than that shown in FIG. 1A. For example, in some cases, a computing device that includes the keyboard 100 may be a laptop computer, a desktop computer, or the like. In such cases, the housing of the keyboard may refer to a housing of the laptop or desktop computer, or indeed a housing of any product, component, or device in which the keyboard 100 is integrated or otherwise positioned. In some embodiments, the keyboard 100 may be a standalone keyboard (e.g., it need not be incorporated into a cover or case of a separate computing device).

The keyboard 100 includes a group of keys, including the representative key 106. While the instant application describes components of a representative key 106 of the keyboard 100, the concepts and components described herein apply to other keys of the keyboard 100, as well as other depressible input mechanisms, including buttons, standalone keys, switches, or the like. Moreover, such keys, buttons, or switches may be incorporated into other devices, including smart phones, tablet computers, watches, handheld electronic devices, standalone keyboards, or the like.

Figure 1B:
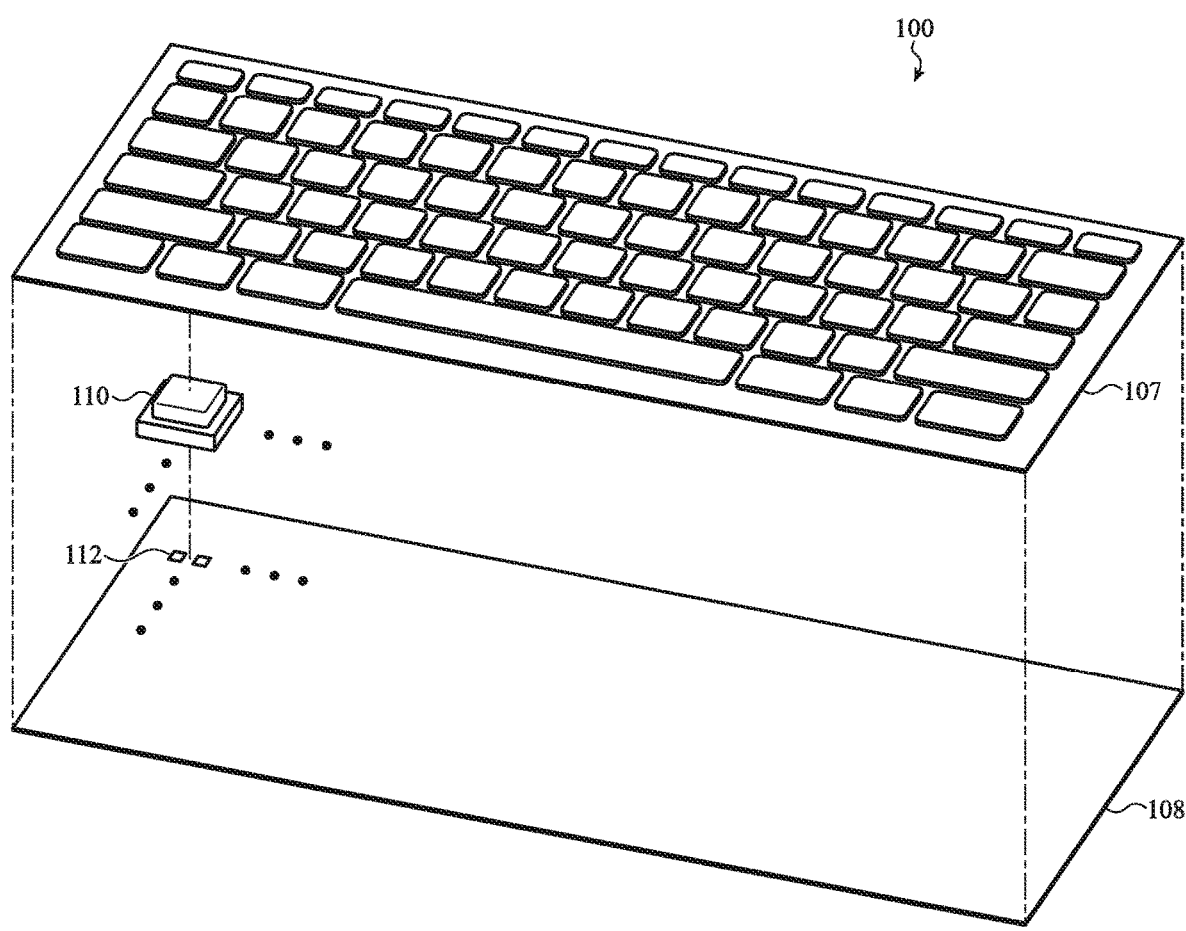
FIG. 1B shows an exploded view of the keyboard of FIG. 1A.

FIG. 1B shows an exploded view of the keyboard 100 of FIG. 1A. In particular, the keyboard 100 includes a keyboard base 108 and a group of switch assemblies 110. The keyboard 100 also includes the optional flexible material 107 over the switch assemblies 110. As described above, the keyboard 100 may be assembled by mounting pre-assembled switch assemblies 110 to the keyboard base 108. Because the switch assemblies 110 are pre-assembled, the keyboard 100 may be produced more quickly and/or more efficiently than with discrete, unassembled key components. For example, as noted above, the switch assemblies 110 may be mounted on a tape and applied to the keyboard base 108 using a tape-and-reel machine. Other automated handling processes and machines are also possible, such as pick-and-place machines, surface mount technology machines, or any other component placement apparatus may pick up switch assemblies 110 and position them on a base or substrate (e.g., the keyboard base 108) in any suitable arrangement and/or location.

As the switch assemblies 110 are placed on the substrate, or after they are all placed on the substrate, the keyboard may be further processed to secure the switch assemblies 110 to the substrate. For example, as described herein, the switch assemblies 110 may include electrical terminals exposed on a bottom surface, and the keyboard base 108 may include electrical contacts 112. Accordingly, the switch assemblies 110 may be placed on the keyboard base 108 such that the terminals and the contacts are in contact with one another, and then the keyboard base 108 and the switch assemblies 110 may be subjected to a reflowing process where heat is applied to at least partially melt solder between the terminals of the switch assemblies 110 (e.g., the conductive terminals 322, 324, 504, and/or 506 shown in FIGS. 3-5B) and the electrical contacts 112 of the keyboard base 108 (e.g., which correspond to the contacts 423, 426, 508, and/or 510 shown in FIGS. 3-5B), thereby securing the switch assemblies 110 to the keyboard base 108 and also forming an electrical path between the switch assemblies 110 and the keyboard base 108. Other techniques and materials may be used to secure the switch assemblies to the keyboard base 108. For example, a conductive adhesive or other joining material, such as a conductive epoxy, silver paste, anisotropic conductive adhesive (or paste or film), or the like, may be applied to the conductive terminals and/or the electrical contacts. The switch assemblies 110 may then be applied to the keyboard base 108, thereby securing the switch assemblies to the keyboard base and forming the electrical connections using the joining material.

Figure 3:
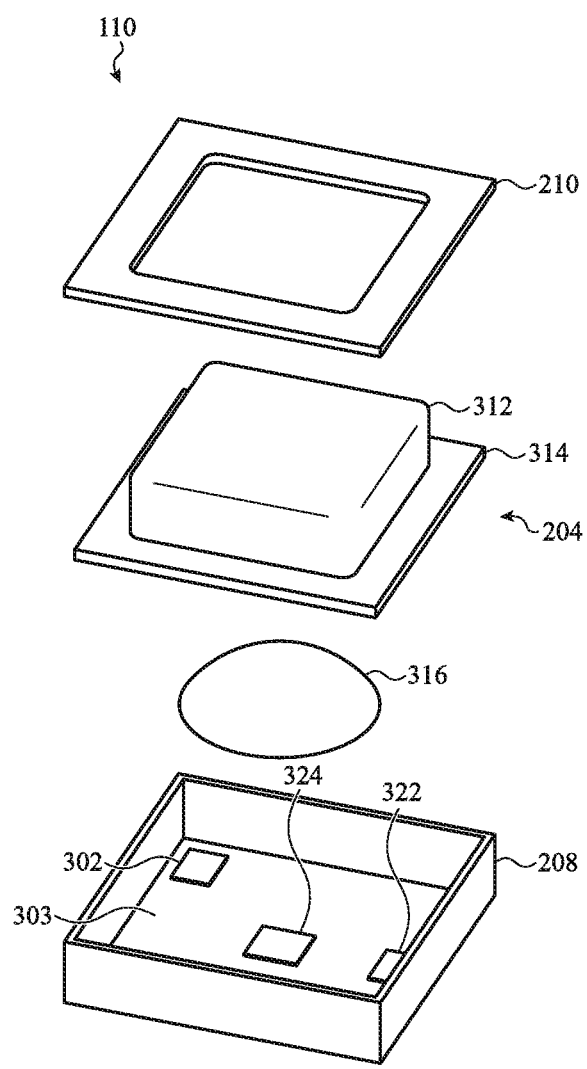
FIG. 3 shows an exploded view of the switch assembly of FIG. 2.
Figure 7:
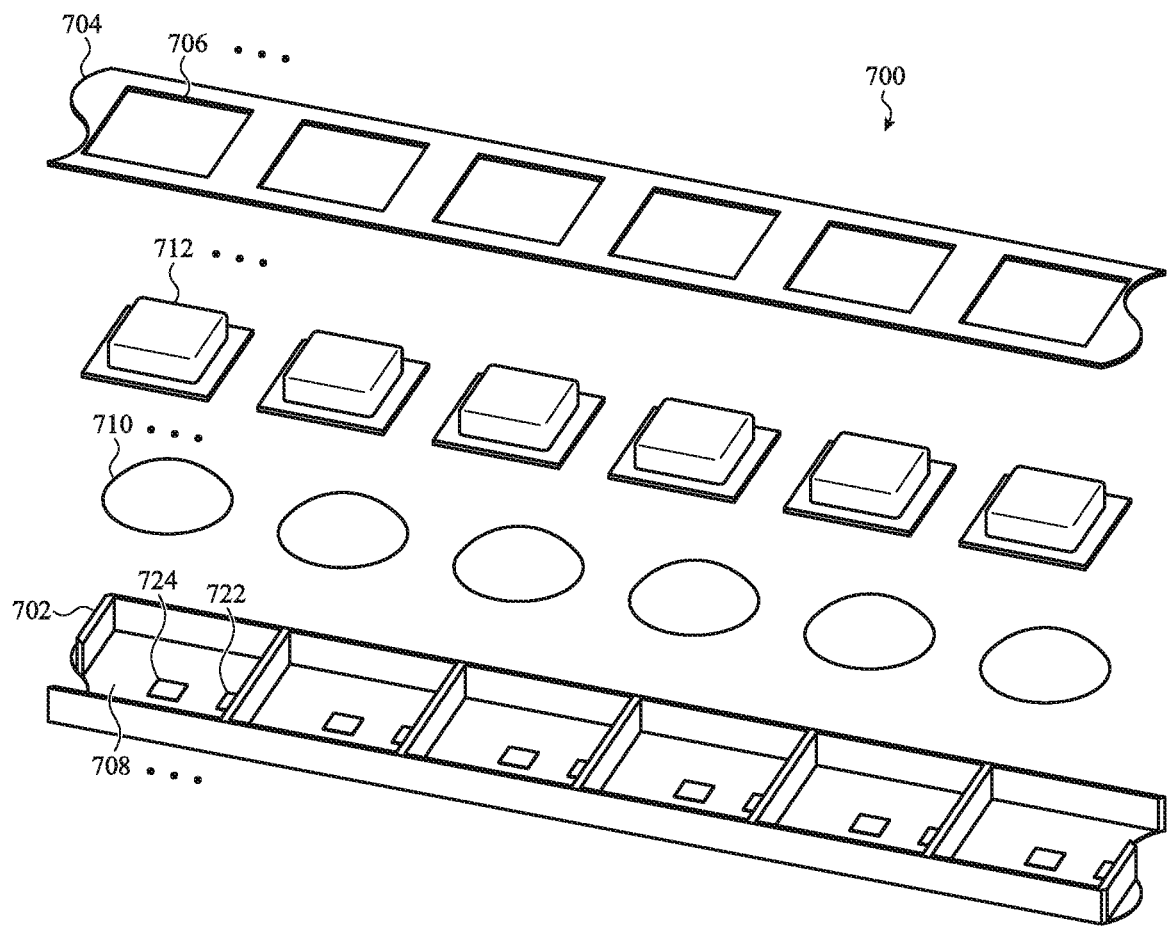
FIG. 7 shows an exploded view of an example switch row assembly.

FIG. 3 shows an exploded view of the switch assembly 110. An example process for assembling the switch assembly 110 will be discussed with respect to this exploded view. In the example assembly process, a collapsible dome 316 is placed in an interior volume of the switch body 208. An outer edge (or any other appropriate portion) of the dome 316 is placed in contact with the first terminal 322, and a portion of the dome 316 is positioned relative to the second terminal 324 such that, when the dome 316 is collapsed and/or deformed, it will contact the second terminal 324. The actuation member 204 (or any other actuator or appropriate component or member) is then placed over the dome 316. The cover 210 is placed on the switch body 208 such that the actuation member 204 extends through an opening in the cover 210. The cover 210 may also overlap a retention feature 314 (here, a flange) of the actuation member 204. The cover 210 is then secured to the switch body 208, for example, via ultrasonic welding, laser welding, adhesive, solder, or the like. In some embodiments, the cover 210 and switch body 208 are formed of a unitary (e.g., monolithic) component. In such cases, a bottom panel 303 of the switch body 208 shown in FIG. 3 may be separable from the unitary body/cover component. Thus, the dome 316 may be placed on the bottom panel 303, and the unitary body/cover component may be placed on and attached to the bottom panel 303. (The actuation member 204 may be placed on the bottom panel 303 or in the body/cover component prior to attachment.) FIG. 7, discussed below, illustrates an example switch assembly that includes a unitary body/cover component and separable bottom panel, as described above.

FIG. 3 also shows a light source 302 coupled to the switch body 208. As shown, the light source 302 is positioned so that the dome 316 does not cover or otherwise occlude the light source 302. This is one example location for the light source 302, however, and it may be positioned in other locations on (or at least partially encapsulated within) the switch body 208 as described herein. In some cases, the dome 316 may be formed from or include an at least partially transparent material. In such cases, the light source 302 may be positioned under the dome 316 to illuminate the dome 316. The dome 316 may act as a light diffuser and/or light guide to direct and distribute light from the light source 302 toward a desired location or component of the switch assembly 110.

Figure 4:
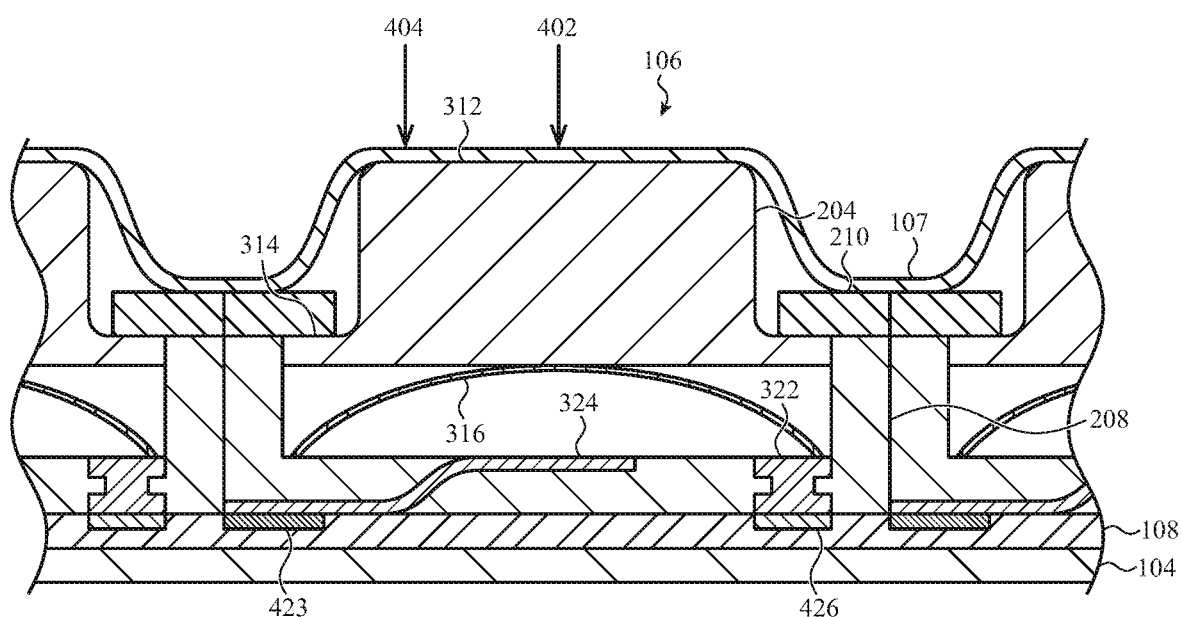
FIG. 4 shows a partial cross-sectional view of the keyboard of FIG. 1A.

FIG. 4 shows a partial cross-sectional view of the keyboard 100, viewed along line A-A in FIG. 1A and showing details of the representative key 106. As noted above, the key 106 includes a switch body 208 that defines an interior volume, a cover 210, and a collapsible dome 316 (or other collapsible switching element) within the interior volume of the switch body 208.

The key 106 also includes the actuation member 204 (or other suitable actuator) that is configured to actuate the collapsible dome 316 in response to the actuation member translating. In particular, the actuation member 204 is configured to transmit a force from the key 106 to the collapsible dome 316, thereby collapsing the dome 316. This, in turn, causes an input to be registered by the keyboard 100 (and/or the computing device 101). In addition, the collapsible dome 316 generally biases the actuation member 204 upward (with respect to the view of FIG. 2), thereby keeping the actuation member in a default or rest position in the absence of external force. Likewise, when force is removed from the actuation member 204 after the dome 316 collapses, the dome 316 (or other collapsible switching element) returns to its default configuration as shown in FIG. 4, thereby moving the actuation member from a depressed to rest position.

The cover 210 is secured to the switch body 208 and retains the actuation member 204 to the switch cover 210. The cover 210 may be secured to the switch body 208 in any appropriate way, such as welding (e.g., laser welding or ultrasonic welding), adhesives, mechanical interlocks, insert molding or co-molding (e.g., the cover 210 may be positioned in a mold, and material may be injected into the mold to form the switch body 208 so that the switch body 208 is coupled to the cover 210), or the like. Together, the switch body 208 and the cover 210 form a switch housing, where the switch body 208 defines a body portion of the switch housing and the cover 210 defines a top portion of the switch housing.

An actuation surface 312 of the actuation member 204 may be configured to receive inputs directly from a user. For example, the key 106 may be configured so that no additional keycaps or input components are needed in order for the key 106 to be used in a keyboard. In other embodiments, additional keycaps, input components, surface layers, covers, or the like, may be coupled to the actuation member 204 to define an external actuation surface of the key 106.

The actuation member 204, and in particular the retention feature or flange 314 of the actuation member 204, may be configured to slide against or otherwise engage with the interior surfaces of the switch body 208 of the switch housing to maintain the alignment of the actuation member 204 during actuation and to prevent binding or sticking of the actuation member 204 during actuation. The retention feature 314 may be any suitable feature, such as a tab, flange, protrusion, nub, or the like.

The key 106 may be configured so that the actuation member 204 does not significantly wobble during actuation. For example, an input (e.g., top) surface of the actuation member 204 may remain substantially horizontal (relative to the orientation shown in FIG. 4) when the actuation member 204 is pressed downwards, regardless of where on the actuation member 204 a force is applied. More particularly, the actuation member 204 may be configured to remain substantially horizontal in response to a force applied to the center of the actuation member 204 (indicated by arrow 402) or a force applied to an edge or corner of the actuation member (indicated by arrow 404). In other cases, the key 106 may be configured to allow the actuation member 204 a certain amount of deviation from horizontal in response to forces applied at different locations on the actuation surface. The additional travel at the edges or corners of the actuation member 204 may provide the sensation of a longer travel than is actually provided by the dome 316. Because the sensation of longer key travel may be more desirable to some users, allowing some wobble in the actuation member 204 may allow the key 106 to have a smaller vertical height while still maintaining the feeling of a taller, longer-travel key.

The retention feature 314 may overlap an underside surface of the top portion (e.g., the cover 210) of the switch housing. For example, as shown, the actuation member 204 has a top-hat type design, where the retention feature 314 is a flange that overlaps and engages an interior surface of the cover 210. The engagement between the retention feature/flange 314 defines an upper travel limit of the actuation member 204 and also retains the actuation member 204 to the switch housing. In order to assemble the key 106, the actuation member 204 may be placed in the switch body 208 prior to the cover 210 being attached. Thus, the flange (or other retention feature 314) may be securely captured within the interior volume of the switch body 208.

In other embodiments, the actuation member 204 may lack the retention feature 314, or may include a retention feature of a different configuration. For example, where a scissor or hinge mechanism is used to movably support an actuation member, the actuation member may be retained to the scissor or hinge mechanism and may omit the flange shown in FIGS. 3 and 4.

The actuation surface 312 may have any suitable shape or configuration. For example, the actuation surface 312 may define a substantially rectangular or square actuation surface, as shown in FIGS. 3 and 4. The actuation surface 312 may define other shapes instead, such as substantially circular shapes. In some cases, the actuation surface 312 may define the ultimate shape of the user-interface portion of a key. For example, the actuation surface 312 may define the actual exterior surface of the key 106 that a user contacts when actuating the key, or a fabric covering may conform to the actuation surface 312 such that the resulting shape of the fabric surface of the key 106 is substantially the same as the actuation surface 312. Accordingly, the actuation surface may have a shape and size (and any other properties) that produces a suitable user-interface portion of a key. In other cases, another component may be attached to or otherwise cover the actuation surface 312, and that other component may define the shape of the user-interface portion of a key. For example, an additional keycap may be positioned over the actuation surface 312 to define the shape or other property of the user-interface portion of a key.

The collapsible switching element (here, a dome) 316 is an example of a collapsible switching element that may be used in the key 106. The dome 316 may be formed from or include a metallic or other conductive material, and may be configured to complete an electrical path (e.g., circuit) when the actuation member 204 collapses or otherwise deforms the dome. For example, the switch body 208 may include conductive terminals 322, 324. The collapsible dome 316 may be electrically coupled to the first terminal 322 and, when collapsed or otherwise deformed, may contact the second terminal 324. This forms an electrical path between the first terminal 322 and the second terminal 324. Other collapsible switching elements, such as alternative domes, switches, contacts, or components may be used in place of or in addition to the collapsible switching element 316 and terminals 322, 324.

The terminals 322, 324 may be molded or otherwise formed in the switch body 208. For example, the terminals 322, 324 may be inserted into a mold prior to injection of a material that forms the switch body 208 (e.g., the body portion of the switch housing). Accordingly, the terminals 322, 324 may be at least partially encapsulated in the switch body 208. As one non-limiting example, a first portion of each terminal 322, 324 is exposed to the interior volume of the switch body 208 (and configured to contact the collapsible switching element 316), and a second portion is exposed on an exterior surface of the switch body 208. The second portions of the terminals 322, 324 may be electrically coupled to electrical contacts 426 and 423 of a keyboard base 108 (which correspond to the electrical contacts 112 in FIG. 1A).

The keyboard base 108 may be any appropriate substrate onto which the keys of the keyboard 100 (including the key 106) may be mounted or coupled. For example, the keyboard base 108 may be a printed circuit board. Alternatively, the keyboard base 108 may be a portion of the keyboard housing 104 itself, such as a metal or plastic wall defining both an interior and an exterior surface of the keyboard housing 104. The keyboard base 108 may be any other suitable material or component, including polyethylene terephthalate, flexible circuit material, or the like.

The key 106 may also include one or more optical sensors within the switch body 208. The optical sensors may be used to detect a distance that the actuation member 204 has moved. The keyboard 100 (or other associated device) may use this information to determine when the actuation member 204 has been moved a sufficient distance to register an input. As such, optical sensors may be used instead of or in addition to the conductive terminals 322, 324 and the dome 316 to detect key presses and register inputs. The optical sensors may also be used to determine an amount of force applied to the actuation member. For example, the dome 316 may provide a known biasing force against the actuation member 204. Accordingly, a deflection or movement of the actuation member 204 that acts against the biasing force (e.g., collapses the dome 316) can be correlated to a particular force value. By detecting the input force, a keyboard 100 (or other associated device) can differentiate between different types of inputs, and may take different actions based on the different types of inputs. For example, a device may perform one type of action in response to a low force input (e.g., enter a lower case character into an application) and another type of action in response to a high force input (e.g., enter an upper case character into an application).

The optional optical sensor(s) may be positioned in any suitable location in the key 106. For example, an optical sensor may be coupled to a bottom surface of the switch body 208, such as adjacent the exposed portion of the conductive terminal 324, or on an underside of the actuation member 204. In either case, the dome 316 may have an opening or window to provide a clear optical path between the actuation member 204 and the switch body 208. In one example embodiment, an optical sensor may be coupled to a central or middle portion of the actuation member 204, and the dome 316 may define an opening in a central or middle portion of the dome. The optical sensor may thus sense the switch body 208 (and/or the conductive terminal 324) to detect a deflection distance of the actuation member 204.

The optical sensor(s) may be integrated into the switch body 208. For example, the switch body 208, or a portion thereof, may be molded around an optical sensor to at least partially encapsulate the optical sensor in the switch body 208. More particularly, similar to the process of encapsulating an LED or a conductive terminal in the switch body 208, an optical sensor may be inserted into a mold, and then the material for the switch body 208 may be introduced into the mold to at least partially encapsulate and retain the optical sensor. The optical sensor(s) may also be attached and/or retained to the switch body 208 mechanically. For example, the switch body 208 may include retaining features such as clips, undercuts, cavities, posts (e.g., for heat staking), latches, or the like, molded into or otherwise formed on an interior surface of the switch body 208. After the switch body 208 is formed, the optical sensor(s) may be engaged with the retaining features to retain them to the switch body 208.

As noted above, the keyboard 100 may also include a flexible material 107 coupled to the keyboard housing and extending over the actuators of the keys (e.g., the actuation member 204). The flexible material may be any appropriate material, such as a fabric (which may be formed from natural fibers, synthetic fibers, or both, and may be woven, knit, etc.), a polymer, leather, or any other appropriate sheet or material. As noted above, the flexible material 107 may be bonded (e.g., adhered, welded, or the like) to the keyboard housing 104 of the keyboard 100. For example, the flexible material 107 may be bonded to a perimeter portion of the keyboard housing 104 that surrounds the keys. The flexible material 107 may also or instead be bonded to portions of the keys. For example, areas of the flexible material 107 that are between the actuation members 204 form troughs that extend into the gaps between the actuation members 204 and are bonded to the top surfaces of the covers 210. In some cases, the flexible material 107 is formed such that the areas between the actuation members 204 form troughs while the material is in an unstrained state. For example, the troughs may be molded or otherwise formed into the flexible material 107. The material may then be overlaid on a keyboard such that the troughs are positioned within the gaps between the actuation members 204. In some cases, the flexible material 107 is not bonded to the covers 210, or is bonded to only some covers 210 or portions of the covers. For example, the flexible material 107 may be bonded to the covers 210 in the gaps between some, but not all, of the actuation members 204. In this fashion, the flexible material 107 does not fully separate from the keyboard 100, but is permitted to float relative to many of the keys. Such floating may also allow air to vent from underneath the actuation members 204 and/or the collapsible domes 316 during actuation of the keys, as air thus can pass out of the switch body 208.

The housings (e.g., the switch bodies 208) of adjacent keys may abut one another. That is, as shown in FIG. 4, sides of adjacent switch bodies 208 may be in contact with one another such that the covers 210 (or top portions) of adjacent switch housings define a continuous (or substantially continuous) surface framing the actuation members. The top surfaces may thus define a keyboard web around the actuation members of the keys. As such, the keyboard 100 may not include a separate web above the switch housings, such as a plastic or metal component with openings for the actuation members to pass therethrough. Such webs may be used in certain keyboards to provide added rigidity to the keyboard and/or to shield, seal, or cover sensitive components. Because a web is not necessary in the instant keyboard, the keyboard can be made thinner and lighter than keyboards that require or use a web.

A surface defined by the covers 210 of adjacent keys may be considered continuous if it supports the flexible material 107 without the flexible material 107 visibly extending or deforming into gaps that may exist between the switch bodies, and does not necessarily mean that no miniscule or incidental gaps exist between any of the switch bodies 208.

In some embodiments, the actuation members of the keys are configured to directly contact both the collapsible domes 316 beneath the actuation members and the flexible material 107 (e.g., without interstitial actuators or components). For example, a bottom side or surface of the actuation member 204 may directly contact a top of the collapsible dome 316, and a top surface of the actuation member 204 may directly contact a bottom surface of the flexible material 107. In some cases, an adhesive such as a pressure sensitive adhesive, heat sensitive adhesive, or the like, may bond the top surface of the actuation member 204 directly to the bottom surface of the flexible material 107. Because force is transmitted to the collapsible dome 316 through the flexible material 107 and actuation member 204 without additional components such as keycaps, the overall height of the keys of the keyboard 100 may be less than with other key designs. Also, because there are fewer moving and interacting parts, the keyboard 100 may be more robust and durable, and may be faster and less expensive to build. In other cases, such as where the flexible material 107 is not used, keycaps or other interface members may be coupled to the actuation member 204, or may replace the actuation member 204.

In certain embodiments, the flexible material 107 (or other deformable sheet) may include sensing elements that are configured to be coupled to touch-sensing circuitry of an electronic device. Accordingly, in addition to inputs from the keys of the keyboard 100 (e.g., detected via the collapsible dome 316 and associated terminals and contacts), touch inputs that do not result in key actuation may be detected based on contact with the flexible material 107. Example inputs include taps, strikes, presses, or other discrete-type inputs, as well as gestures, such as swipes, drags, pinches, or other inputs. Such inputs may be used to move a cursor on a screen, for example, or manipulate windows, applications, or other aspects of a user interface.

The sensing elements may be any appropriate components or materials that can be used to facilitate touch sensing. For example, the sensing elements may be conductive elements, such as conductive threads, wires, sheets, or other materials, that are woven, layered, or otherwise incorporated in or on the flexible material 107. The sensing elements may be configured to facilitate touch-sensing functionality in any appropriate way. For example, the sensing elements may include a first sensing element (e.g., a conductive element or group of conductive elements) configured to act as a capacitive drive element, and a second sensing element (e.g., a conductive element or group of conductive elements) configured to act as a capacitive sense element. In particular, an electrical signal may be transmitted through the first sensing element, and the second sensing element may be monitored or analyzed to determine an extent to which a signal induced in the second sensing element by the electrical signal has been changed due to a touch event on the flexible material 107. By sensing and/or analyzing the second sensing element (e.g., the capacitive sense element), an electronic device can determine whether and where a user has touched the flexible material 107.

The key 106 may also include light sources 302, such as light emitting diodes (e.g., micro-LEDs), that illuminate all or part of the key 106. For example, one or more LEDs may be mounted to, embedded in, or otherwise coupled to the switch body 208 (or any other component of the key 106). The one or more LEDs may direct light through a transparent or translucent portion of the actuation member 204 corresponding to a glyph (e.g., a letter) or other representation that is visible on the top surface of the key 106. The one or more LEDs may also or instead illuminate any other portion of the key 106. For example, the one or more LEDs may illuminate areas around the actuation member 204, such as gaps between the actuation member 204 and the switch body 208. As another example, the one or more LEDs may illuminate the switch body 208, the cover 210, or any other component of the key 106. In such cases, any of the components of the key 106 may be formed from or include transparent or translucent materials. Such materials may guide and project light from the light source (e.g., the one or more LEDs) through and out of the material. For example, as discussed with respect to FIG. 5B, below, where an LED is encapsulated in an at least partially transparent material of the switch body 208, the material may guide light from the LED towards areas to be illuminated. In some cases, light may be transmitted between components. For example, light may be transmitted by the switch body 208 into the actuation member 204 to illuminate a glyph or other portion of the actuation member 204 (or surrounding areas). As another example, light may be transmitted into the cover 210 (which may also be light transmissive) to illuminate an area around the actuation member 204 and/or to transmit light into the actuation member 204.

The key 106 may include a single LED or multiple LEDs. Where multiple LEDs or other light sources are used, they may include any color or combinations of colors. For example, the key 106 may include one or more white LEDs, or multiple LEDs of different colors (e.g., red, green, and blue). Where LEDs or light sources of different colors are used, they may be controlled independently of one another to produce different light colors or other visual effects (e.g., the intensity and/or color of each LED may be controlled independently). LEDs used in the key 106 may be bare die LEDs or packaged die LEDs.

Figure 5A:
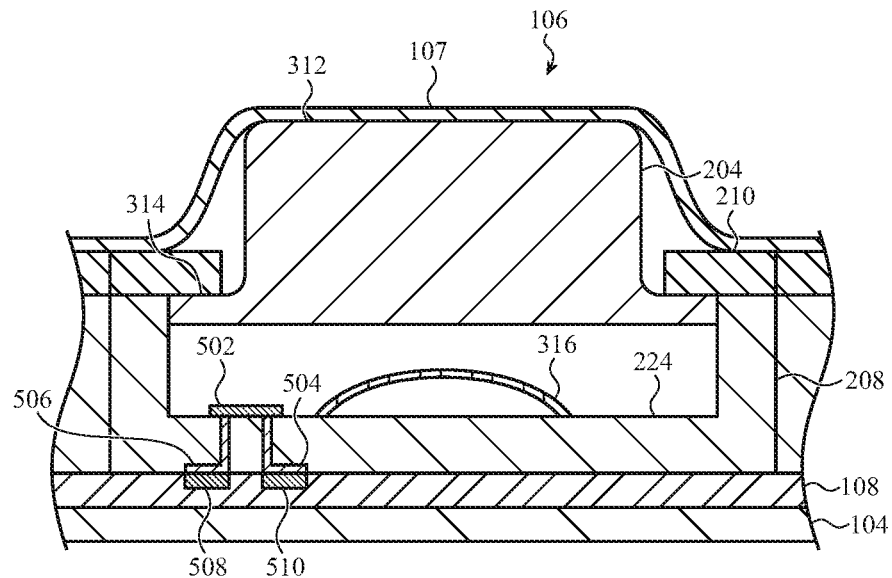
FIGS. 5A-5B show partial cross-sectional view of the keyboard of FIG. 1A.

FIG. 5A shows a partial cross-sectional view of the key 106, viewed along line B-B in FIG. 1A. The view shown in FIG. 5A is similar to that in FIG. 4, but corresponds to a different area of the key 106. In particular, FIG. 5A shows an LED 502 (e.g., a light source 302) coupled to the switch body 208 and connected to conductive terminals 504, 506, which may be similar to the conductive terminals 322, 324 described above with respect to FIG. 3, and may be formed in substantially the same way (e.g., insert-molding). The conductive terminals 504, 506 electrically and/or communicatively couple the LED 502 to the keyboard base 108. More particularly, the keyboard base 108 may include electrical contacts 508, 510, which may be similar to the electrical contacts 423, 426 in FIG. 4. When the switch assembly is coupled to the keyboard base 108, the conductive terminals 504, 506 may be mechanically retained against and electrically coupled to the electrical contacts 508, 510. For example, the terminals 504, 506 and the contacts 508, 510 may be coupled together with a conductive adhesive, such as a silver paste, conductive epoxy, anisotropic conductive adhesive, or the like, as described herein. Accordingly, the act of mounting or coupling the switch body 208 to the keyboard base 108 may form electrical connections between the LED 502 in the switch body 208 and an LED controller and/or power source external to the switch body 208.

The LED 502 may be coupled to a surface of the switch body 208, as shown in FIG. 5A. For example, the switch body 208 may be formed with the conductive terminals 504, 506 at least partially encapsulated therein. The LED 502 may then be attached (e.g., adhered, heat staked, mechanically fastened, etc.) to the switch body 208 and electrically connected to the conductive terminals 504, 506.

Figure 5B:
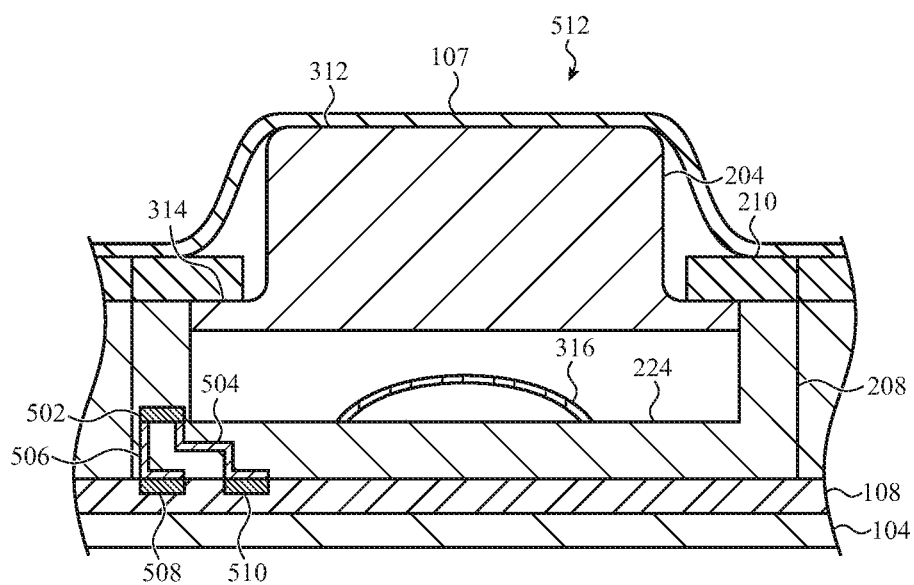

As noted above, the LED 502 may be instead be partially or fully encapsulated in the switch body. FIG. 5B shows a partial cross-sectional view of key 512 in which the LED 502 is encapsulated in the material of a switch body 501, which may otherwise be the same as or similar to the switch body 208. (In all other respects, the key 512 may correspond to the key 106.) The LED 502 may be encapsulated in the material in the same manner as the conductive terminals 504, 506. For example, the LED 502 and the conductive terminals 504, 506 may be positioned in a mold, and a material may thereafter be introduced into the mold, thereby encapsulating the LED 502 and the conductive terminals 504, 506 in the material. The material may be at least partially transparent to receive and guide light from the LED 502 and direct the light to a desired location or component of the key 106.

Instead of or in addition to LEDs or other light sources, the key 106 may be illuminated by a light guide that guides light from a remote light source into the switch body 208. In such cases, a light guide, such as a fiber optic member, glass, plastic, or other suitable light-guiding material or component, may be encapsulated in or otherwise coupled to the keyboard base. When the at least partially transparent switch body 208 is coupled to the keyboard base, the switch body 208 may be positioned in optical communication with the light guide to receive light therefrom.

Figure 2:
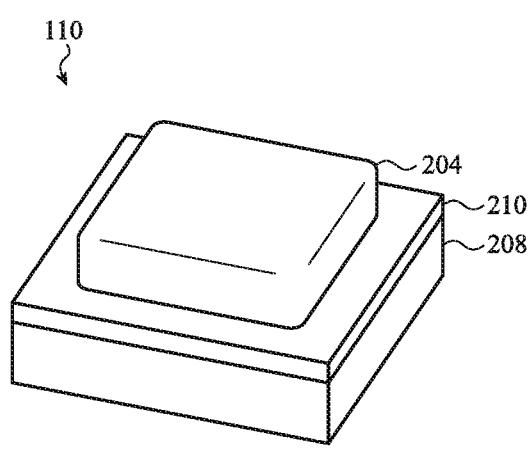
FIG. 2 shows an example switch assembly.
Figure 6A:
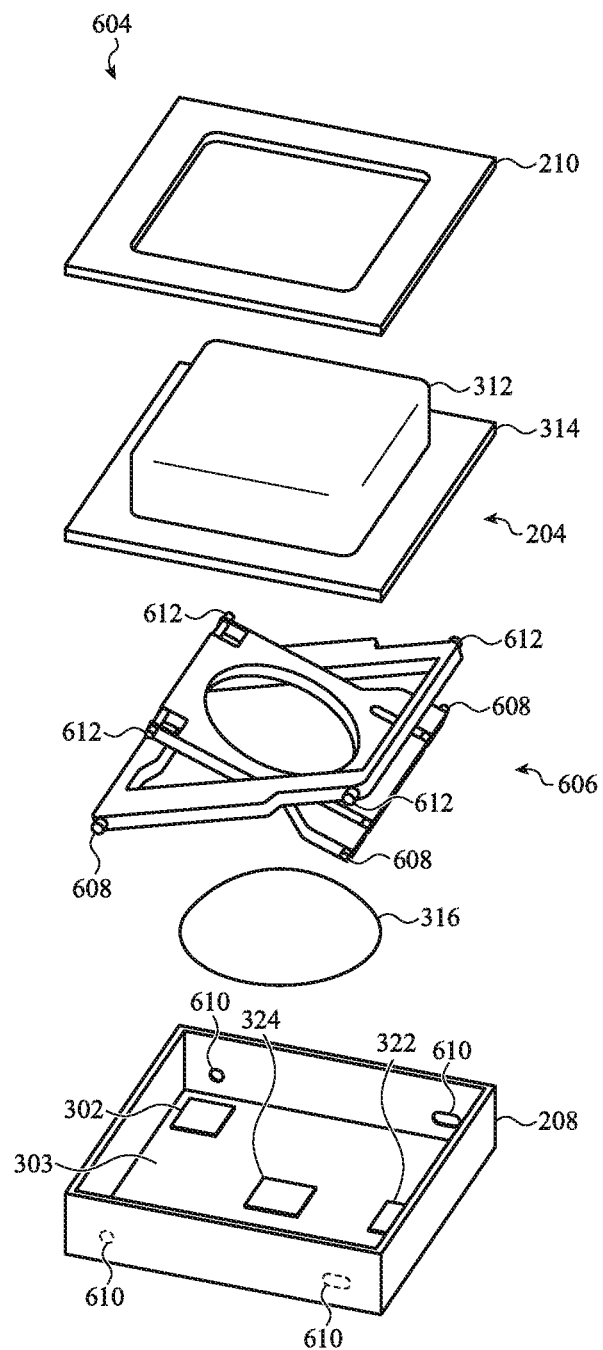
FIGS. 6A-6B show exploded views of another switch assembly.

FIG. 6A shows an exploded view of a switch assembly 604, which is similar to the switch assembly 110 shown in FIGS. 2-3 but includes a scissor mechanism 606. In particular, the scissor mechanism 606 is coupled to the switch body 208 and to the actuation member 204 and movably supports the actuation member 204 relative to the switch body 208. The scissor mechanism 606 may include pins 608 that engage with recesses 610 (or other features) in the switch body 208 to retain the scissor mechanism 606 to the switch body 208, and keycap pins 612 that engage with attachment members (e.g., clips, slots, recesses, etc.) of the actuation member 204 to retain the actuation member 204 to the scissor mechanism 606. Because the actuation member 204 is retained to the switch body 208 via the scissor mechanism 606, the actuation member 204 does not require the retention feature 314 (e.g., the flange 314) to retain the actuation member 204 to the switch body 208. In some cases, however, the flange may nevertheless be included, for example, to help guide and/or support the actuation member 204, to prevent ingress of liquid or other contaminants into the switch body 208, or the like.

Figure 6B:
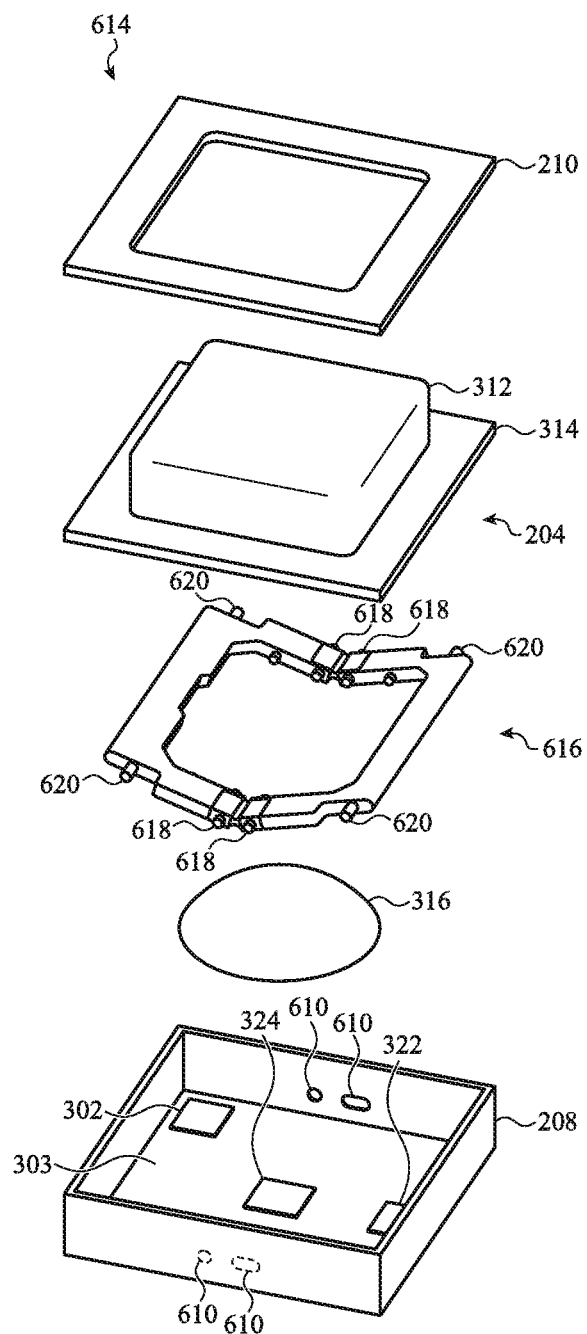

FIG. 6B shows an exploded view of a switch assembly 614, which is similar to the switch assemblies 110, 604 shown in FIGS. 2-3 and 6A, but includes a butterfly hinge 616. The butterfly hinge 616 is coupled to the switch body 208 and to the actuation member 204 and movably supports the actuation member 204 relative to the switch body 208. Similar to the scissor mechanism 606, the butterfly hinge 616 may include pins 618 that engage with recesses 610 (or other features) in the switch body 208 to retain the butterfly hinge 616 to the switch body 208, and keycap pins 620 that engage with attachment members (e.g., clips, slots, recesses, etc.) of the actuation member 204 to retain the actuation member 204 to the butterfly hinge 616. As described with respect to FIG. 6B, because the butterfly hinge 616 retains the actuation member 204 to the switch body 208, the retention feature 314 may be omitted.

Electrical contacts, light sources, and optional optical sensors are omitted from FIGS. 6A-6B for clarity, but may be included as shown and described with respect to FIGS. 3 and 5A-5B.

FIG. 7 shows an exploded view of a multi-switch assembly 700. The multi-switch assembly 700 may include any of the components and/or features described above with respect to the key 106. By combining the mechanisms for multiple keys into a multi-switch assembly, manufacturing and assembly of a keyboard may be further streamlined. For example, each row of keys for a keyboard may be pre-assembled into a single multi-switch assembly, and then attached to the keyboard base. This may further reduce the part count, assembly time, and/or assembly complexity of a keyboard. Moreover, by reducing the number of discrete components that must be coupled to the keyboard base, alignment errors between the base and the key components may be further reduced, as well as the additional time required to align and attach each discrete key component.

The multi-switch assembly 700 includes a switch body 702 that defines multiple switch receptacles 708. The switch receptacles 708 at least partially define an interior volume in which components of a key or switch may be positioned.

The switch body 702 is otherwise similar to the switch body 208 described above. The switch body 702 may be a unitary structure formed from a polymer material, an at least partially transparent polymer, or any other suitable material. The switch body 702 may have electrical contacts 722, 724, light sources (e.g., LEDs), optical sensors, or other components at least partially encapsulated therein, as described above with respect to the switch body 208. Domes 710 (similar to the dome 316) may be positioned in the receptacles 708 in the switch body 702, and may be aligned relative to the electrical contacts 722, 724 as described above with respect to FIG. 3. A cover 704 defines openings 706 through which actuation members 712 may at least partially extend. The cover 704 may also retain the actuation members 712 (and other components of the multi-switch assembly 700) in the switch body 702.

As shown, the cover 704 includes one opening 706 for each receptacle 708 in the switch body 702. In other examples, however, the cover may be configured to cover the receptacles of multiple switch bodies. For example, the cover may form a key web for a complete keyboard, and the keyboard may include several multi-switch assemblies (e.g., one multi-switch assembly for each row of the keyboard). In yet other cases, multiple covers may be attached to the switch body 702. For example, a separate cover (such as the cover 210, described above) may be positioned over each receptacle 708 in the switch body 702. Also, while the multi-switch assembly 700 is shown as defining a single row of switches or keys, a multi-switch assembly in accordance with the concepts described herein may define multiple rows and/or columns of keys or switches. For example, the switch body 702 may define a receptacle for each key of a complete keyboard.

While the multi-switch assembly 700 is shown without a separate support mechanism for the actuation members, this is merely one implementation. In other examples, a support mechanism, such as a scissor mechanism 606 (FIG. 6A) or a butterfly hinge 616 (FIG. 6B), may be included in all or some of the receptacles of the multi-switch assembly 700.

Figure 8:
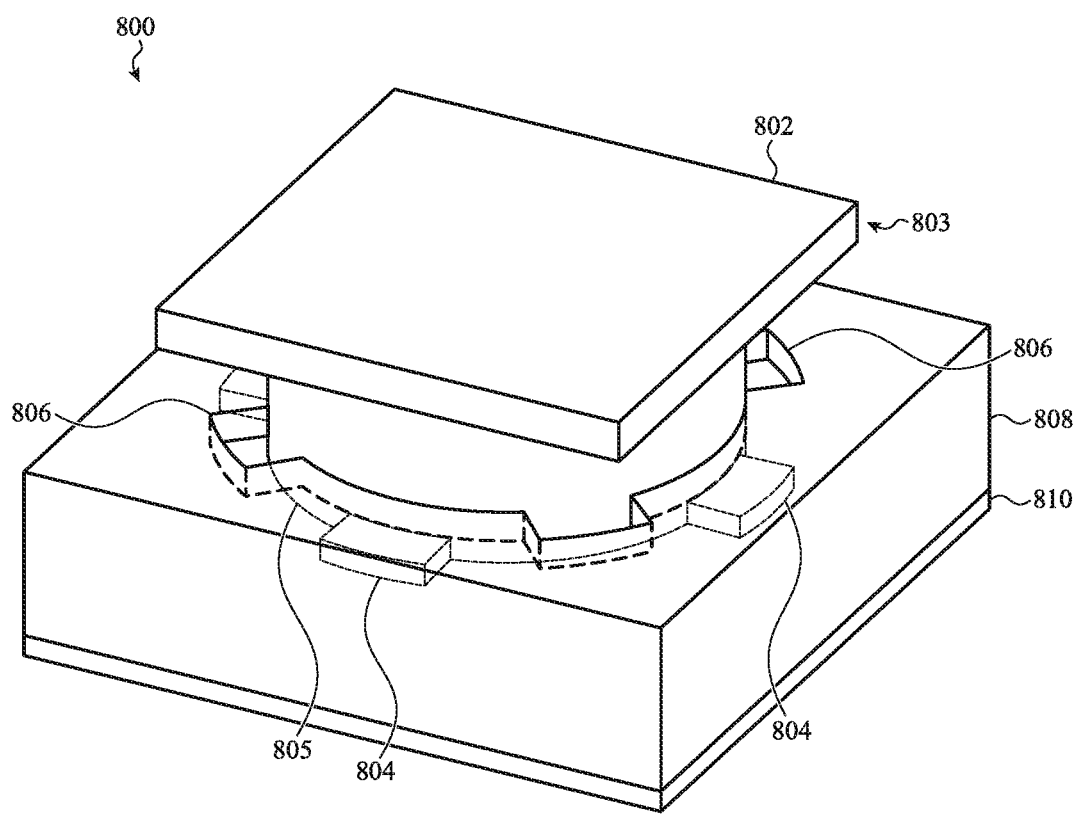
FIG. 8 shows another example switch assembly.

FIG. 8 shows an example switch assembly 800. The switch assembly 800 is similar to the switch assembly 110 described above, but includes a different mechanism for attaching and retaining an actuation member 802 to a switch housing.

As shown in FIG. 8, a switch body 808 defines an interior volume and includes an opening through which the actuation member 802 extends. In particular, the switch body 808 defines a body portion and a cover or top portion, and the opening extends through the top portion. The switch body 808 may be coupled to a bottom panel 810 to form an interior volume similar to that formed by the switch bodies and covers shown in FIGS. 3-5B. The bottom panel 810 may include insert-molded terminals, such as those shown and described with respect to FIG. 4-5B.

The actuation member 802 includes a shaft 805 (which may be substantially cylindrical, as shown) and a cap portion 803 (which may be substantially rectangular or square, as shown, or any other appropriate shape) at an end of the shaft 805. The actuation member 802, including the shaft 805 and the cap portion 803, may be a unitary (e.g., monolithic) component, such as may be formed by injection molding a polymer material. The cap portion 803 of the actuation member 802 may extend radially from the shaft 805 and overhang a top portion of the switch body 808, and may be larger than the opening in the switch body 808 through which the shaft 805 extends.

The actuation member 802 also includes retention tabs 804 that are configured to engage with an undercut or other engagement feature of the switch body 808 to retain the actuation member 802 to the switch body 808. For example, as shown in FIG. 8, the retention tabs 804 extend from the shaft 805 of the actuation member 802 and engage with an underside of the top portion of the switch body 808. The top portion of the switch body 808 may include an opening defined by an edge, and the edge may include or define a group of recesses 806 that are configured to allow the retention tabs 804 to pass into the interior volume of the switch body 808. The actuation member 802 may then be rotated until the retention tabs 804 are moved away from the recesses 806 and engage with or overlap the underside of the top portion of the switch body 808. The switch body 808 may include a protrusion or other feature that limits rotational travel of the actuation member 802. For example, a retention tab 804 or other protrusion may extend downwardly from the underside of the top portion of the switch body 808 at a position away from the recesses 806. Thus, when the actuation member 802 is rotated after insertion into the opening, the retention tab 804 contacts the tab and prevents or limits further rotation. In this fashion, the retention tab 804 may prevent the actuation member from rotating back to its "insertion" position and so prevent decoupling of the actuation member from the switch body 808.

Any of the components described herein may include fiducial markers (or simply "fiducials") that facilitate pick-and-place or other automated assembly and manufacturing processes. For example, switch assemblies may include fiducials to facilitate assembly of a keyboard. More particularly, an assembly machine may include cameras, vision systems, or other sensors that detect the fiducials to help identify, locate, and position the components relative to one another during assembly of the keyboard. Similarly, a keyboard base or substrate may include fiducials to help position switch assemblies relative to the base during assembly of the keyboard. Fiducials may be incorporated in or on the components in any appropriate way. For example, they may be printed, applied (e.g., as a sticker or other layer), etched, molded, machined, or the like.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

What is claimed is:

1. A switch assembly for a keyboard, comprising:
a switch housing comprising:
 a switch body defining an interior volume, a bottom surface, and a lateral width; and
 a cover defining an opening;
a collapsible dome within the interior volume;
an actuation member positioned in the opening and comprising a retention feature that engages the switch body, thereby retaining the actuation member to the switch housing and retaining the collapsible dome within the interior volume;
a first terminal retained to the switch housing and comprising a first portion configured to be contacted by the collapsible dome when the actuation member is depressed and a second portion at the bottom surface and flush with the bottom surface within the lateral width, the first portion of the first terminal being flush with an inner surface of the switch housing; and
a second terminal partially encapsulated in a floor of the switch body such that a first portion of the second terminal is exposed to the interior volume through the floor of the switch body and a second portion of the second terminal is positioned at the bottom surface and flush with the bottom surface within the lateral width, the second terminal remaining in electrical contact with the collapsible dome when the actuation member is depressed and when the actuation member is undepressed, the first portion of the second terminal being flush with the inner surface of the switch housing;
wherein the switch housing, the collapsible dome, the actuation member, the first terminal, and the second terminal are assembled into an integrated unit configured to be mounted directly on a keyboard base.

2. The switch assembly of claim 1, wherein:
the switch assembly is incorporated into a keyboard comprising additional switch assemblies, each additional switch assembly comprising:
 an additional switch housing;
 an additional actuation member; and
 an additional terminal retained to the switch housing;
the switch assembly and the additional switch assemblies are electrically coupled to the keyboard base via the first and second terminals and the additional terminals; and
the actuation members of the switch assembly and the additional switch assemblies each define a shape of a user-interface portion of a respective key of the keyboard.

3. The switch assembly of claim 1, wherein:
a first portion of the first terminal is exposed to the interior volume;
a second portion of the first terminal is exposed on an exterior surface of the switch body; and
the switch assembly is configured to be mounted on the keyboard base via a surface mount process whereby the second portion of the first terminal is placed in contact with a conductive terminal of the keyboard base.

4. The switch assembly of claim 1, wherein:
the cover is secured to the switch body;
the retention feature is a flange;
the flange overlaps a surface of the cover; and
the collapsible dome biases the actuation member in an undepressed position.

5. The switch assembly of claim 4, wherein the first terminal is at least partially encapsulated in the switch body.

6. The switch assembly of claim 1, wherein the switch housing abuts an adjacent switch housing configured to be mounted on the keyboard base.

7. A keyboard comprising:
a keyboard housing;
a keyboard base positioned on a portion of the keyboard housing, the keyboard base having a first contact and a second contact;
a switch assembly mounted to the keyboard base, comprising:
 a switch body defining an interior volume, the switch body being placed directly on the keyboard base such that the first contact and the second contact are positioned within a footprint of the switch body;
 a first terminal formed within the switch body, the first terminal being in electrical contact with the first contact and having a portion exposed to the interior volume;
 a second terminal formed within the switch body, the second terminal being in electrical contact with the second contact and having a portion exposed to the interior volume, the first and second terminals having height dimensions equal to a vertical thickness of a bottom wall of the switch body;
 a collapsible dome positioned in the interior volume;
 an actuation member configured to actuate the collapsible dome in response to an actuation of the actuation member; and
 a cover coupled to the switch body and retaining the actuation member to the switch body; and
a flexible material coupled to the keyboard housing and extending over the actuation member.

8. The keyboard of claim 7, wherein the flexible material defines an exterior surface of the keyboard.

9. The keyboard of claim 7, wherein the flexible material is a woven fabric.

10. The keyboard of claim 7, wherein the flexible material is bonded to the keyboard housing.

11. The keyboard of claim 7, wherein:
a first side of the actuation member contacts the collapsible dome; and
a second side of the actuation member contacts the flexible material.

12. The keyboard of claim 7, wherein the second terminal is molded in the switch body.

13. The keyboard of claim 7, wherein:
the switch assembly is a first switch assembly;
the keyboard further comprises a group of second switch assemblies; and
the flexible material extends over the group of second switch assemblies.

14. The keyboard of claim 7, wherein the switch body is a first switch body, and wherein the keyboard further comprises a second switch body mounted to the keyboard base, the second switch body being positioned adjacent to and abutting the first switch body.

15. A keyboard comprising:
a keyboard base;
a group of switch assemblies coupled to the keyboard base, each switch assembly comprising:
 a switch housing;
 an actuation member within the switch housing; and
a flexible material comprising a woven fabric covering the group of switch assemblies and comprising sensing elements configured to be coupled to touch-sensing circuitry of an electronic device, the sensing elements comprising:
 a first conductive element woven into the woven fabric and configured to act as a capacitive drive element; and
 a second conductive element woven into the woven fabric and configured to act as a capacitive sense element; wherein
the switch housings of at least two adjacent switch assemblies abut one another.

16. The keyboard of claim 15, wherein the flexible material is bonded to top surfaces of the switch housings.

17. The keyboard of claim 16, wherein the top surfaces of the switch housings define a continuous surface framing each of the actuation members.

18. The keyboard of claim 16, wherein the flexible material is bonded to top surfaces of the actuation members.

19. The keyboard of claim 15, wherein the keyboard does not include a web above the switch housings.

* * * * *